(12) United States Patent
Fleischmann

(10) Patent No.: US 12,347,701 B2
(45) Date of Patent: Jul. 1, 2025

(54) MOLDING DEVICE WITH SELF-BLOCKING FEED CHANNEL

(71) Applicant: Robert Bosch GmbH, Stuttgart (DE)

(72) Inventor: Martin Fleischmann, Herrenberg (DE)

(73) Assignee: ROBERT BOSCH GMBH, Stuttgart (DE)

( * ) Notice: Subject to any disclaimer, the term of this patent is extended or adjusted under 35 U.S.C. 154(b) by 219 days.

(21) Appl. No.: 17/787,993

(22) PCT Filed: Feb. 3, 2021

(86) PCT No.: PCT/EP2021/052550
§ 371 (c)(1),
(2) Date: Jun. 22, 2022

(87) PCT Pub. No.: WO2021/160490
PCT Pub. Date: Aug. 19, 2021

(65) Prior Publication Data
US 2023/0050046 A1    Feb. 16, 2023

(30) Foreign Application Priority Data

Feb. 11, 2020 (DE) ...................... 10 2020 201 666.6

(51) Int. Cl.
*H01L 21/67* (2006.01)
*B29C 45/14* (2006.01)
(Continued)

(52) U.S. Cl.
CPC .. *H01L 21/67126* (2013.01); *B29C 45/14655* (2013.01); *B29C 45/2704* (2013.01);
(Continued)

(58) Field of Classification Search
CPC ............ H01L 21/67126; H01L 21/565; H01L 23/3121; B29C 45/14655; B29C 45/2704;
(Continued)

(56) References Cited

U.S. PATENT DOCUMENTS

2014/0206122 A1   7/2014   Fernandez et al.
2015/0089758 A1   4/2015   Buchholz

FOREIGN PATENT DOCUMENTS

CN          1927570 A     3/2007
CN        107206709 A     9/2017
(Continued)

OTHER PUBLICATIONS

Machine English translation of DE102012000627, Accessed Jun. 7, 2024 (Year: 2013).*

(Continued)

*Primary Examiner* — Jacob T Minskey
*Assistant Examiner* — Adrianna N Konves
(74) *Attorney, Agent, or Firm* — NORTON ROSE FULBRIGHT US LLP

(57) ABSTRACT

A molding device for producing a molded module. The molding device has one tool part and one further tool part, which together enclose a cavity. At least one of the tool parts has at least one dividing web arranged and configured to subdivide the cavity into at least a low-pressure sub-cavity and a high-pressure sub-cavity. The tool part has at least two feed channels, of which a low-pressure feed channel opens into the low-pressure sub-cavity and has a smaller cross-section at least over a longitudinal portion than a high-pressure feed channel opening into the high-pressure sub-cavity. The low-pressure feed channel is configured to become pressure-resistantly blocked through hardening of the molding compound once a predetermined time interval has elapsed or during the interval. The high-pressure feed channel is configured to conduct a molding pressure into the cavity for a longer time interval than the low-pressure feed channel.

14 Claims, 3 Drawing Sheets

(51) Int. Cl.
  *B29C 45/27*  (2006.01)
  *B29C 45/77*  (2006.01)
  *H01L 21/56*  (2006.01)
  *B29C 45/26*  (2006.01)
  *B29L 31/34*  (2006.01)

(52) U.S. Cl.
  CPC ............ *B29C 45/77* (2013.01); *H01L 21/565* (2013.01); *B29C 2045/2687* (2013.01); *B29C 2045/279* (2013.01); *B29C 2945/76006* (2013.01); *B29C 2945/76056* (2013.01); *B29C 2945/76257* (2013.01); *B29C 2945/76274* (2013.01); *B29L 2031/3481* (2013.01)

(58) Field of Classification Search
  CPC ............ B29C 45/77; B29C 2045/2687; B29C 2045/279; B29C 2945/76006; B29C 2945/76056; B29C 2945/76257; B29C 2945/76274; B29C 45/14836; B29C 45/2708; B29C 45/14639; B29C 45/27; B29C 2045/2691; B29C 45/14434; B29C 45/2703; B29L 2031/3481
  See application file for complete search history.

(56) References Cited

FOREIGN PATENT DOCUMENTS

| | | | |
|---|---|---|---|
| DE | 10162450 A1 | 7/2003 | |
| DE | 102007041982 A1 | 3/2008 | |
| DE | 102012000627 A1 * | 7/2013 | ......... B29C 44/0469 |
| DE | 102014100281 A1 | 7/2015 | |
| DE | 102018100576 A1 | 7/2019 | |
| EP | 2490250 A1 | 8/2012 | |
| JP | H0820040 A | 1/1996 | |
| JP | H1128754 A | 2/1999 | |
| JP | 2001191361 A | 7/2001 | |
| WO | 2007078356 A2 | 7/2007 | |
| WO | 2018210391 A1 | 11/2018 | |

OTHER PUBLICATIONS

International Search Report for PCT/EP2021/052550, Issued Mar. 30, 2021.

* cited by examiner

MOLDING DEVICE WITH SELF-BLOCKING FEED CHANNEL

FIELD

The present invention relates to a molding device for producing a molded module.

SUMMARY

In accordance with an example embodiment of the present invention, the molding device has one tool part and one further tool part. The tool part and the further tool part together enclose a cavity. At least one, or just one, of the tool parts has at least one dividing web. The dividing web is arranged and configured to subdivide the cavity into at least two, or just two sub-cavities, namely a low-pressure sub-cavity and a high-pressure sub-cavity. The tool part has at least two feed channels, of which a low-pressure feed channel opens into the low-pressure sub-cavity and has a smaller cross-section at least over a longitudinal portion than a high-pressure feed channel opening into the high-pressure sub-cavity. The low-pressure feed channel is configured to become pressure-resistantly blocked through hardening of the molding compound, in particular once a predetermined time interval has elapsed or during said interval. The high-pressure feed channel is configured in the meantime to conduct a molding pressure into the cavity for a longer time, in particular a longer time interval, than the low-pressure feed channel. In this way, the molding compound in the high-pressure feed channel may remain liquid, in particular viscous, and thereby allow the molding pressure to continue to act on the high-pressure sub-cavity, and the molding compound introduced in this way into the high-pressure sub-cavity. Once the low-pressure feed channel has been blocked by hardened molding compound, the molding compound introduced into the low-pressure sub-cavity is no longer able to receive the molding pressure which is preferably generated by a common press device configured to allow the molding pressure to act on both the low-pressure feed channel and the high-pressure feed channel. It is thus advantageously possible, during one molding process in one and the same tool comprising the tool parts, to produce mutually different molded bodies which have been produced with mutually differing process pressures, referred to above also as molding pressure.

In one preferred example embodiment of the present invention, the low-pressure feed channel has a narrowed longitudinal portion, in particular compared with the adjacent channel portion, the cross-sectional diameter or cross-sectional area of which narrowed portion amounts to less than half of the cross-sectional diameter or cross-sectional area of the high-pressure feed channel. Advantageously, the molding compound may thus solidify in the narrowed longitudinal portion of the low-pressure feed channel after a predetermined residence time, and thereby reliably block the narrowed longitudinal portion. The molding pressure, which may be then be increased by the press device, can thus only continue to act on the high-pressure sub-cavity via the still viscous molding compound in the high-pressure feed channel, whose cross-sectional diameter is sufficiently large for the molding compound to be unable to solidify therein.

In a preferred example embodiment of the present invention, the dividing web is configured and arranged to be placed, in particular spring-mounted, onto a circuit carrier enclosed by the tool parts, and to subdivide the cavity formed in this way between the circuit carrier and the tool part into the low-pressure cavity and the high-pressure cavity. Advantageously, two mutually different molded bodies or molded humps may in this way be produced on a circuit carrier, said molded bodies or humps having been produced in each case with mutually different process pressures. Advantageously, pressure-sensitive components, for example an electrolytic capacitor, a sensor or an oscillating quartz crystal, can in this way be embedded in the molding compound of a molded body produced in the low-pressure sub-cavity. Advantageously, the electrolytic capacitor, the sensor or the oscillating quartz crystal thus cannot be destroyed by an excessively high molding pressure, for example of over 20 bar. In the high-pressure sub-cavity, electronic components which are arranged on the circuit carrier in a surface region adjoining the high-pressure sub-cavity may thus advantageously be embedded in molding compound. The components arranged in the high-pressure sub-cavity may in this way be embedded in molding compound under a molding pressure of between 50 and 200 bar, preferably between 80 and 150 bar, more preferably 100 bar. Advantageously, good underfill characteristics can in this way be achieved with a molding pressure of the above level, such that the molding compound can also flow into narrow gaps between an electronic component, for example an integrated circuit, and the circuit carrier.

In one preferred embodiment of the present invention, the tool part has a press device connected to the tool part or molded onto the tool part. The press device is configured in particular to press viscous molding compound into the feed channels. Advantageously, in this way mutually different molded bodies with in each case mutually differing process pressures can be produced with just one molding tool and in one molding process step.

In one preferred embodiment of the present invention, the molding device has a pressure sensor. The pressure sensor is configured to detect a molding pressure, in particular a process pressure, in the low-pressure feed channel. The pressure sensor is advantageously arranged in the region of the low-pressure cavity. Advantageously, the molding device may in this way, prior to an increase in molding pressure, starting at 20 bar and up to 200 bar, detect said molding pressure in the region of the low-pressure sub-cavity and thereby ensure that the low-pressure feed channel is tightly closed by a molding compound solidified therein. The molding device more preferably has a processing unit, in particular a microprocessor or a microcontroller, the processing unit being configured to receive a pressure signal produced by the pressure sensor, and to raise a molding pressure as a function of the pressure signal.

In a preferred embodiment of the present invention, the molding device has a molding compound flow rate detection device which is configured to detect a molding compound flow rate flowing in the low-pressure feed channel and to generate a molding compound flow rate signal representing the molding compound flow rate. The molding device is more preferably configured to control the molding pressure or the molding compound as a function of the molding compound flow rate signal. Advantageously, the molding compound flow rate may in this way be detected during the molding process by the molding device, such that blocking of the low-pressure feed channel can be reliably detected using the molding compound flow rate signal.

The molding compound flow rate detection device has a dielectric sensor, which is configured to detect (preferably capacitively) a dielectric property of the molding compound and capacitively to detect movement, in particular flow of the molding compound. The molding compound flow rate sensor is configured to generate, as a function of the detected flowing molding compound, a molding compound flow rate signal representing a change in capacitance or the capacitance in the region of the low-pressure feed channel. Advantageously, blockage of the low-pressure-feed channel can thus be detected by sensor, in order in this way further to increase the molding pressure beyond the maximum pressure value, in particular 20 bar, predetermined for the low-pressure sub-cavity.

In a preferred embodiment of the present invention, the molding device is configured to increase the molding pressure once the predetermined time interval has elapsed. The molding device is preferably configured to increase the molding pressure after introduction of the molding compound into the sub-cavities up to a molding pressure of 20 bar and, once the predetermined time interval has elapsed, preferably to increase the molding pressure further as a function of the pressure signal and/or compound flow rate signal up to 100 bar. Advantageously, a molded module with molded bodies produced with in each case mutually differing process pressures can be produced in this way with just one molding tool.

The present invention also relates to a molded module, in particular produced by means of a molding device of the above-described type. In accordance with an example embodiment of the present invention, the molded module has at least one pressure-sensitive component, in particular an electrolytic capacitor, an oscillating quartz crystal or a sensor, the pressure-sensitive component being embedded in a molded body or a molded hump which has been produced with a molding pressure of less than or equal to 20 bar. The molded module preferably has a circuit carrier, the molded body being molded onto the circuit carrier or the circuit carrier being embedded in the molded hump. The molded body with the pressure-sensitive component may for example be produced in the low-pressure sub-cavity of the already described molding device. Advantageously, the pressure-sensitive component may in this way be embedded undamaged in the molded body produced using a plastics die-casting method, for example using transfer molding or using direct injection molding. In this respect, the molded module has two mutually different molded bodies, namely a high-pressure molded body and a low-pressure molded body, pressure-insensitive components in each case being embedded in the high-pressure molded body and the pressure-sensitive components in each case being embedded in the low-pressure molded body, the low-pressure molded body being produced with lower process pressure than the high-pressure molded body.

The present invention also relates to a method of producing a molded module using a plastics die-casting method, for example using transfer molding or using direct injection molding. According to an example embodiment of the present invention, in the method, in one method step a circuit carrier with electronic components is introduced into a cavity of a molding tool. The cavity is preferably subdivided by the molding tool into a low-pressure sub-cavity and a high-pressure sub-cavity. In a further method step, the low-pressure sub-cavity is filled with molding compound by way of a low-pressure feed channel configured in the molding tool and opening into the low-pressure sub-cavity. The high-pressure sub-cavity is filled with molding compound by way of a high-pressure feed channel configured in the molding tool and opening into the high-pressure sub-cavity.

In the method, the molding pressure, in particular a process pressure acting on the molding compound introduced into the sub-cavities via the feed channels, is increased up to a predetermined low-pressure value, in particular of 20 bar. It is further preferred, after a predetermined time interval, in particular after blocking of the low-pressure feed channel, to increase the molding pressure further, up to a high-pressure value, in particular 100 bar. Advantageously, in this way the molding pressure can no longer act on the low-pressure sub-cavity due to blockage of the low-pressure feed channel. In this way, pressure-sensitive components enclosed in the low-pressure sub-cavity, in particular an electrolytic capacitor, or an oscillating quartz crystal, or a sensor, advantageously cannot be damaged or destroyed by the further increased molding pressure.

Electronic components, in particular at least one, or a plurality of low-pressure components are preferably soldered to the circuit carrier. Pressure-insensitive components, in particular an integrated circuit, a resistor, a film capacitor, or at least one semiconductor component, for example a diode, or another semiconductor component, are also preferably soldered to the circuit carrier. The pressure-insensitive components are preferably embedded in a molded body which has been produced in the high-pressure sub-cavity. Advantageously, a molded module may in this way be formed which has two molded bodies, or molded humps, produced with mutually differing process pressures. The molded bodies, or molded humps, are for example configured on a circuit carrier, and enclose the electronic components arranged on the circuit carrier which project into the respective molded humps.

The present invention will be described below with reference to figures and further exemplary embodiments. Further advantageous variant embodiments result from a combination of the features disclosed herein.

DETAILED DESCRIPTION OF EXAMPLE EMBODIMENTS

Figure 1:
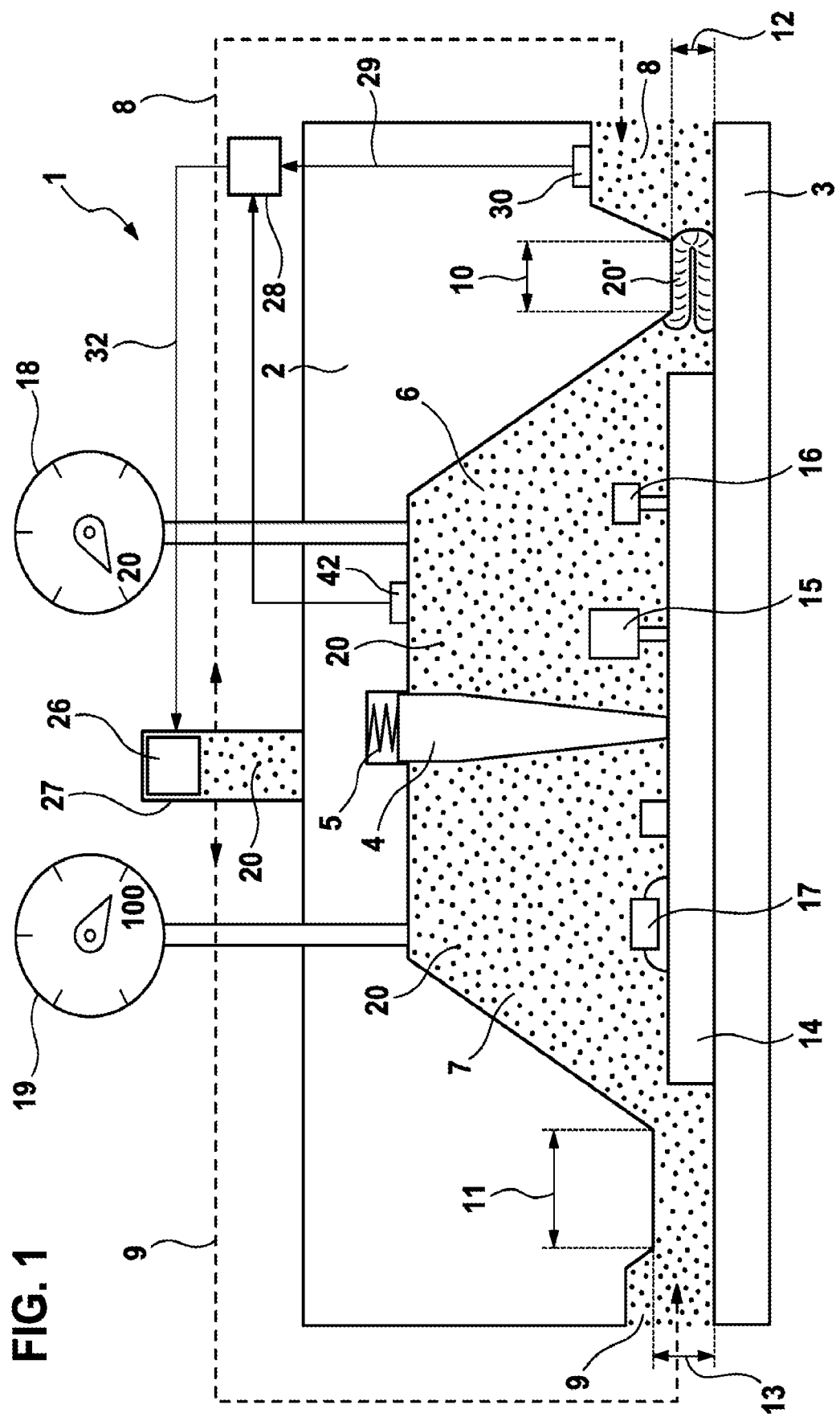
FIG. 1 shows an exemplary embodiment of a molding device of the present invention which is configured to produce a molded module with two mutually different molded bodies in each case produced with mutually differing pressures.

FIG. 1 is a schematic representation of an exemplary embodiment of a molding device 1. The molding device 1 has a tool part 2, and a further tool part 3, which together enclose a cavity. In this exemplary embodiment, the cavity is subdivided into two sub-cavities, namely into a low-pressure sub-cavity 6 and a high-pressure sub-cavity 7, by a dividing wall 4, previously also designated a dividing web, spring-connected to the tool part 3 via a spring 5. A circuit carrier 14 which may be enveloped with molding compound 20 by the molding device 1 is introduced into the twin-shell tool formed in this way. In this exemplary embodiment, the circuit carrier also comprises electronic components connected to the circuit carrier 14, namely low-pressure components 15 and 16, in particular an electrolytic capacitor, a sensor or an oscillating quartz crystal. In this exemplary embodiment, the electrolytic capacitor 15 and the oscillating quartz crystal 16 for example project into the low-pressure sub-cavity 6. In this exemplary embodiment, the circuit carrier 14 lies on tool part 3. Further electronic components, in particular an integrated circuit 17, are also connected to the circuit carrier 14. In this exemplary embodiment, the further components, in particular the circuit 17, project into the high-pressure sub-cavity 7. The further components are less pressure-sensitive, such that, on molding, they can withstand a higher molding pressure.

In this exemplary embodiment, the low-pressure sub-cavity 6 is connected to a low-pressure feed channel 8. The low-pressure feed channel 8 has a cross-sectional area 12 over a longitudinal portion 10. The high-pressure sub-cavity 7 is connected to a high-pressure feed channel 9, which has a cross-sectional area 13 over a longitudinal portion 11. The cross-sectional area 12 of the low-pressure feed channel 8 is smaller than the cross-sectional area 13 of the high-pressure feed channel 9.

To produce a molded module, the circuit carrier 14, to which the electronic components 15, 16 and 17 are soldered, may be placed into the tool, comprising the tool parts 2 and 3, and enclosed by the tool parts 2 and 3. The dividing wall 4 spring-mounted by means of the spring 5 may be placed onto the circuit carrier 14 in such a way that the low-pressure cavity 6 adjoins the circuit carrier 14, and thus also the low-pressure components 15 and 16 but is separated from the high-pressure sub-cavity 7 by the dividing wall 4. The molding compound 20 may then be fed into the molding tool both through the feed opening 8 and the feed opening 9. In the process, the molding compound may flow into the low-pressure sub-cavity 6 through the feed channel 8 opening into the low-pressure sub-cavity 6. The high-pressure sub-cavity 7 may be filled with molding compound via the feed channel 9 opening into the high-pressure sub-cavity 7. Once the molding tool has been filled with molding compound 20, the molding pressure can be raised to 20 bar, and maintained there for a predetermined time interval. During this time interval, the molding compound 20 may agglutinate or solidify to form a solidified molding compound 20' over the longitudinal portion 10 of feed channel 8, which is of narrower configuration over longitudinal portion 10 than is feed channel 9 for the high-pressure sub-cavity 7 over longitudinal portion 11. The low-pressure sub-cavity 6 is thus no longer accessible for a molding pressure which may act on the low-pressure sub-cavity 6 via feed channel 8.

The molding pressure can then be increased further, in this example up to 100 bar, by a press device (not shown in FIG. 1) comprising a plunger. FIG. 1 also shows a pressure detection device 18 which is operatively connected to the low-pressure sub-cavity 6 and a pressure detection device 19 which is operatively connected to the high-pressure sub-cavity 7. In this exemplary embodiment, the pressure detection device 18 shows a molding pressure of 20 bar, which is the maximum that can act on the low-pressure sub-cavity 6 provided the feed channel 8 has been closed by the solidified molding compound 20' blocking it. In this exemplary embodiment, the molding device 1 also comprises a press device 27, which can be molded onto the tool part 2. The press device 27 comprises a plunger 26, which is configured to press a viscous molding compound 20 via the feed channels 8 and 9 into the sub-cavities, in particular the low-pressure sub-cavity 6 and the high-pressure sub-cavity 7 respectively.

In this exemplary embodiment, the molding device 1 also comprises a molding compound flow rate sensor 30. The molding compound flow rate sensor 30 is configured to detect a molding compound flow rate in the feed channel 8, in particular in the region of the low-pressure sub-cavity 6, and to generate a compound flow rate signal representing the molding compound flow rate and output it on the output side via a connecting line to a processing unit 28. The molding device 1 also has a pressure sensor 42, which is arranged and configured to detect the pressure in the low-pressure sub-cavity 6 and to generate a pressure signal representing the pressure and send it to the processing unit 28.

The molding device 1 also comprises the processing unit 28, which is configured to send a control signal via a connecting line 32 to the press device 27 as a function of the molding compound flow rate signal received on the input side and/or as a function of the pressure signal. The press device 27 is configured to increase the molding pressure as a function of the received control signal, in particular starting from 20 bar up to 100 bar.

Advantageously, the press device 27 can thus be instructed, as a function of the detected standstill of the molding compound 20 in the feed channel 8, to increase the molding compound pressure to 100 bar. It may in this way advantageously be ensured that the low-pressure components 15 and 16, in particular an electrolytic capacitor, or an oscillating quartz crystal, cannot be destroyed when the molding compound pressure rises to 100 bar.

Figure 2:
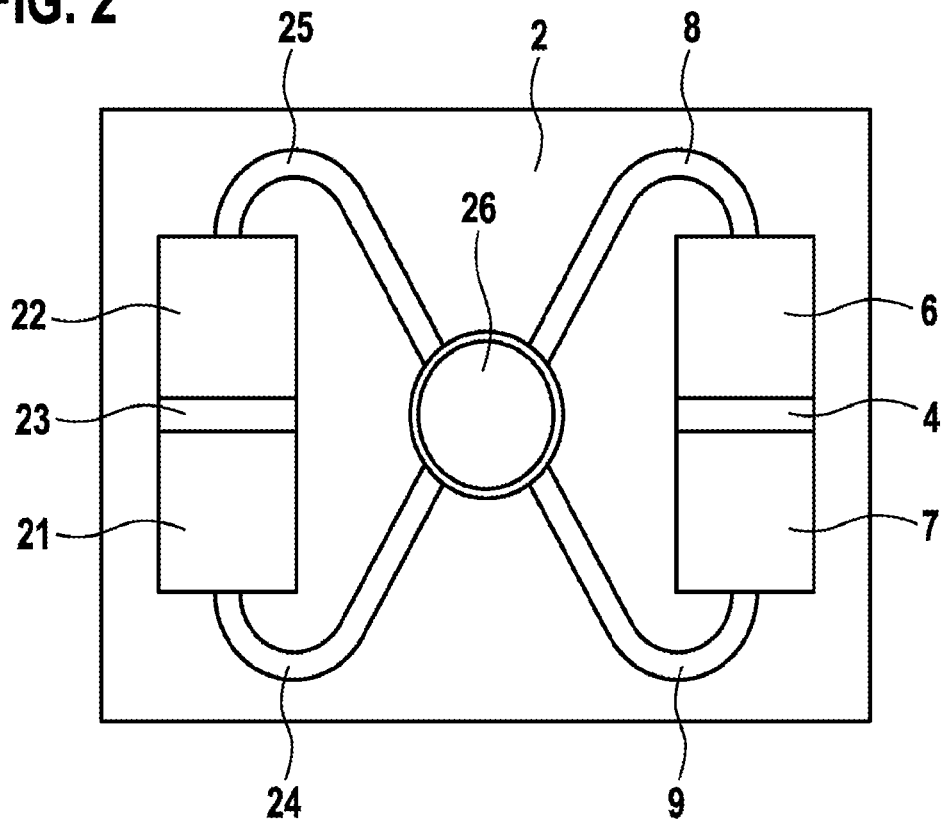
FIG. 2 is a plan view of the molding device already depicted in FIG. 1.

FIG. 2 shows the molding device 1 already shown in FIG. 1, in particular in a plan view onto the tool part 2. In this exemplary embodiment, the tool part 2 comprises the plunger 26 already depicted in FIG. 1 and configured to press a molding pellet, in particular in softened form, as a softened molding compound through the feed channels 8 and 9, and to force it via the feed channels 8 and 9 into the low-pressure sub-cavity 6 and the low-pressure sub-cavity 7 respectively. In this exemplary embodiment, the feed channels 8 and 9 are configured in the tool part 2 as in each case longitudinally extending cavities. FIG. 2 also shows feed channels 24 and 25 operatively connected to the plunger 26, which feed channels lead to two sub-cavities, namely a low-pressure sub-cavity 21, and a high-pressure sub-cavity 22, arranged point-symmetrically to the sub-cavities 6 and 7 and in particular to one another. The feed channel 24 is configured as a low-pressure feed channel which, like the low-pressure feed channel 8 already depicted in FIG. 1, has a constriction configured to cause molding compound to solidify while it is resident in the constriction.

Figure 3:
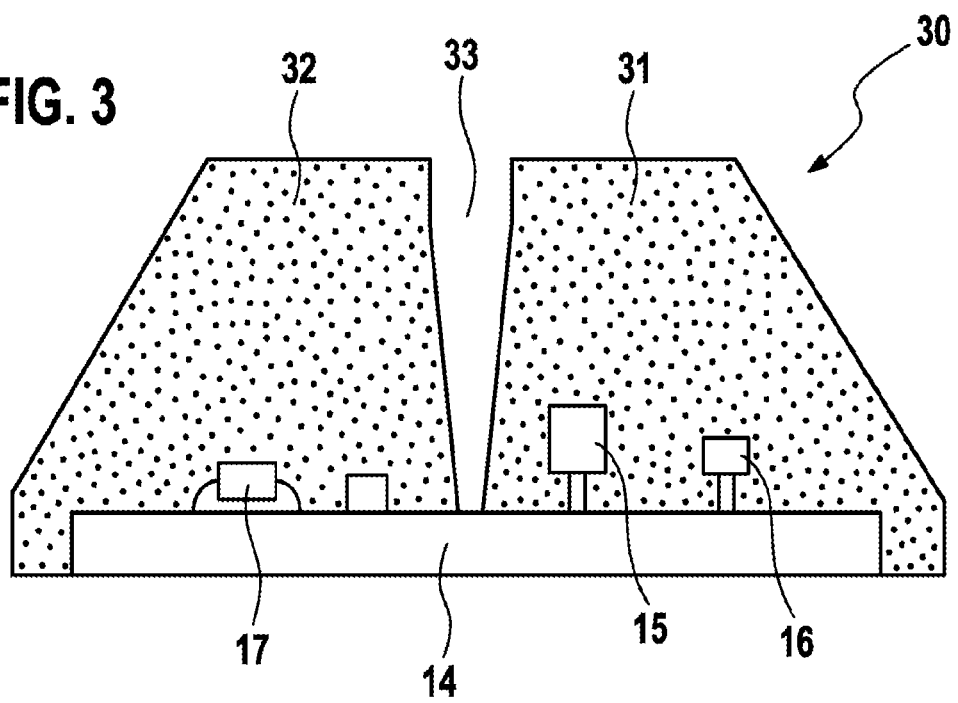
FIG. 3 shows a molded module produced using the molding device depicted in FIGS. 1 and 2, in which pressure-sensitive components and pressure-insensitive components are in each case embedded in mutually different molded bodies.

FIG. 3 shows an exemplary embodiment of a molded module 30. The molded module 30 is produced for example by means of the molding device 1 depicted in FIG. 1. The molded module 30 has a molded body 31 configured as a molded hump, in which the low-pressure components 15 and 16 are embedded. The molded module 30 also has a molded body 32, in which the high-pressure components, in particular the integrated circuit 17, are embedded. The molded bodies 31 and 32 are separated from one another by a trench 33, which extends as far as the circuit carrier 14. The circuit carrier 14 is a component of the molded module 30. In this respect, the molded module has two mutually different molded bodies 31, 32, namely a high-pressure molded body 32 and a low-pressure molded body 31, the pressure-insensitive components 17 in each case being embedded in the high-pressure molded body 32 and the pressure-sensitive components 15, 16 in each case being embedded in the low-pressure molded body 31, the low-pressure molded body 31 being produced with lower process pressure than the high-pressure molded body 32.

Figure 4:
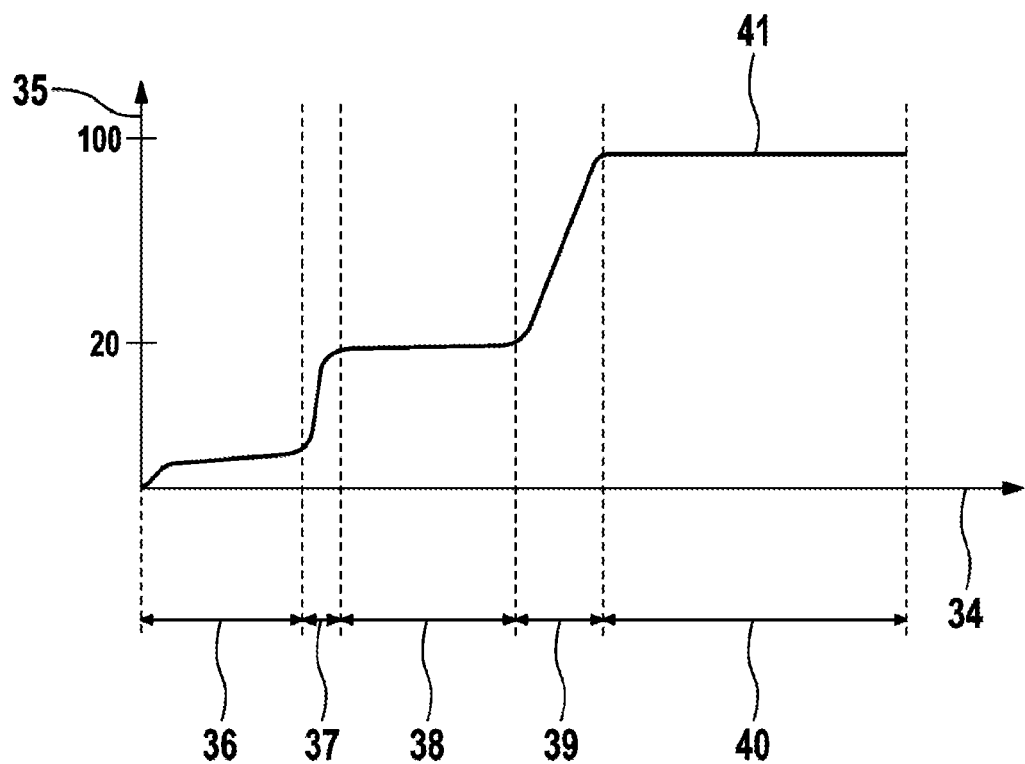

FIG. 4 shows an exemplary embodiment of a diagram having an x-axis 34, and a y-axis 35. In this exemplary embodiment, the x-axis 34 represents a time axis, the y-axis 35 representing a pressure axis of a molding pressure acting on the sub-cavities 6 and 7 during molding using the molding tool 1 depicted in FIG. 1.

FIG. 4 also shows a pressure curve 41, which represents a pressure profile over time of a molding pressure for producing a molded module using the molding device 1 depicted in FIG. 1. During a time interval 36, in a first step for producing a molded module using a rising molding pressure, the low-pressure sub-cavity 6 may be filled with molding compound 20 by the feed channel 8, and the high-pressure sub-cavity 7 by the feed channel 9.

During a subsequent time interval 37, a molding pressure is built up further to a predetermined pressure value, for example of 20 bar, which forms a maximum pressure for the low-pressure sub-cavity 6.

On reaching the predetermined pressure value, in this exemplary embodiment 20 bar, the pressure is maintained at the predetermined pressure value during the time interval 38. During a time interval 38 subsequent to the time interval 37, and accordingly after the pressure build-up, the predetermined molding pressure may be maintained by the mold press device for both sub-cavities, namely the low-pressure sub-cavity 6 and the high-pressure sub-cavity 7. The molding compound 20 can solidify in the feed channel over the longitudinal portion 10 and form a solidified molding compound 20' closing the low-pressure sub-cavity. During a time interval 39 subsequent to time interval 38, the molding pressure may be further increased, until a final pressure is reached for the high-pressure sub-cavity 7. The value of the final molding pressure for the high-pressure sub-cavity 7 amounts in this exemplary embodiment to 100 bar.

The pressure curve 41 thus has five different profile portions. A filling portion, during which the sub-cavities of the molding device are filled with molding compound, extends over time interval 36. A subsequent pressure build-up portion extends over time interval 37, a pressure maintenance portion with a limited pressure value, in particular 20 bar for the low-pressure sub-cavity, extends over time interval 38, a further pressure build-up portion for supplying the high-pressure for the high-pressure sub-cavity 7 extends over time interval 39, and a final pressure portion for maintaining a final pressure for the high-pressure sub-cavity 7 extends over time interval 40.

What is claimed is:

1. A molding device for producing a molded module, the molding device comprising:
    a tool part and a further tool part, which together enclose a cavity, the tool part having at least one dividing wall which is arranged and configured to subdivide the cavity into at least two sub-cavities including a low-pressure sub-cavity and a high-pressure sub-cavity, the tool part having at least two feed channels including a low-pressure-feed channel and a high-pressure feed channel, the low-pressure feed channel opening into the low-pressure sub-cavity and having a smaller cross-section at least over a longitudinal portion than the high-pressure feed channel that opens into the high-pressure sub-cavity, the low-pressure-feed channel being configured to be pressure-resistantly blocked by hardening molding compound during a predetermined time interval, while the high-pressure feed channel is configured to conduct a molding pressure into the cavity for a longer time interval than the low-pressure feed channel.

2. The molding device as recited in claim 1, wherein the low-pressure-feed channel has a narrowed longitudinal portion compared with an adjacent channel portion of the low-pressure feed channel, a cross-sectional diameter or cross-sectional area of which narrowed portion amounts to less than half of a cross-sectional diameter or cross-sectional area of the high-pressure feed channel.

3. The molding device as recited in claim 1, wherein the dividing wall is configured and arranged to be placed spring-mounted onto a circuit carrier enclosed by the tool part and the further tool part, and to subdivide the cavity formed in this way between the circuit carrier and the tool part into the low-pressure cavity and the high-pressure cavity.

4. The molding device as recited in claim 1, wherein the tool part has a press device connected to the tool part or molded onto the tool part which is configured to press viscous molding compound into the feed channels.

5. The molding device as recited in claim 1, wherein the molding device has a pressure sensor, which is configured to detect a molding pressure in the low-pressure-feed channel.

6. The molding device as recited in claim 5, wherein the pressure sensor is arranged in a region of the low-pressure cavity.

7. The molding device as recited in claim 1, wherein the molding device has a compound flow rate detection device which is configured to detect a molding compound flow rate flowing in the low-pressure feed channel, and to generate a molding compound flow rate signal representing the molding compound flow rate, and the molding device is configured to control a molding pressure or a molding compound feed volume as a function of the molding compound flow rate signal.

8. The molding device as recited in claim 1, wherein the molding device is configured to increase a molding pressure once the predetermined time interval has elapsed.

9. A method of producing a molded module using a plastics die-casting method performed with a molding device that comprises a tool part and a further tool part, which together enclose a cavity, the tool part having at least one dividing wall which is arranged and configured to subdivide the cavity into at least two sub-cavities including a low-pressure sub-cavity and a high-pressure sub-cavity, the tool part having at least two feed channels including a low-pressure-feed channel and a high-pressure feed channel, the low-pressure feed channel opening into the low-pressure sub-cavity and having a smaller cross-section at least over a longitudinal portion than the high-pressure feed channel that opens into the high-pressure sub-cavity, the low-pressure-feed channel being configured to be pressure-resistantly blocked by hardening molding compound during a predetermined time interval, while the high-pressure feed channel is configured to conduct a molding pressure into the cavity for a longer time interval than the low-pressure feed channel, the method comprising:
    introducing a circuit carrier with electronic components into the cavity;
    filling the low-pressure sub-cavity with molding compound via the low-pressure feed channel;
    filling the high-pressure sub-cavity with molding compound via the high-pressure feed channel;
    increasing the molding pressure up to a predetermined low-pressure value, and increasing the molding pressure further up to a high-pressure value after the predetermined time interval after the blocking of the low-pressure feed channel.

10. The method as recited in claim 9, wherein the low pressure value is 20 bar and the high-pressure value is 100 bar.

11. The method as recited in claim 9, wherein the die-casting method uses transfer molding or direct injection molding.

12. The molding device as recited in claim 1, further comprising:
- a circuit carrier with electronic components arranged in the cavity;
- molding compound in the low-pressure sub-cavity, having been fed into the low-pressure sub-cavity via the low-pressure feed channel; and
- additional molding compound in the high-pressure sub-cavity, having been fed into the high-pressure sub-cavity via the high-pressure feed channel;
- wherein the molding device is controllable for increasing a molding pressure up to a predetermined low-pressure value, and increasing the molding pressure further up to a high-pressure value after a predetermined time interval after blocking of the low-pressure feed channel.

13. The molding device as recited in claim 12, wherein the low pressure value is 20 bar and the high-pressure value is 100 bar.

14. The molding device as recited in claim 1, wherein the molded module, which the molded device is configured to produce, has at least one pressure-sensitive device, including a electrolytic capacitor or an oscillating quartz crystal or a sensor, which is embedded in a molded body or molded hump which the molding device is configured to produce with a molding pressure of less than or equal to 20 bar.

* * * * *